United States Patent [19]
Vinn et al.

[11] Patent Number: 5,796,303
[45] Date of Patent: Aug. 18, 1998

[54] POPLESS AMPLIFIER

[76] Inventors: Charles L. Vinn, 827 Russell La., Milpitas, Calif. 95035; Bruce G. Armstrong, 1822 Randall Dr., San Mateo, Calif. 94402

[21] Appl. No.: 672,488

[22] Filed: Jun. 26, 1996

[51] Int. Cl.$^6$ ................................................ H03G 3/34
[52] U.S. Cl. ........................ 330/51; 330/149; 381/94; 381/120
[58] Field of Search ..................... 330/51, 149; 381/94, 381/120, 121; 455/212, 218

[56] References Cited

U.S. PATENT DOCUMENTS

| | | |
|---|---|---|
| 4,315,221 | 2/1982 | Numata et al. ................ 330/51 |
| 4,366,442 | 12/1982 | Yamata ........................... 330/51 |
| 5,420,535 | 5/1995 | Nebuloni et al. ................ 330/51 |

*Primary Examiner*—James B. Mullins
*Attorney, Agent, or Firm*—Sarah L. Byrne; Glenn H. Lenzen, Jr.; Andrew J. Rudd

[57] ABSTRACT

An audio amplifier that does not exhibit a "pop" during a change-of-state such as being turned on. The popless amplifier includes an operational amplifier to power a speaker, a circuit to prevent the application of an output voltage from the operational amplifier to the speaker for a selectable period of time and a circuit to charge the output of the operational amplifier to a selectable mid-rail voltage during the time a voltage from the operational amplifier is prevented from reaching the speaker.

25 Claims, 8 Drawing Sheets

POPLESS AMPLIFIER

BACKGROUND OF THE INVENTION

1. Field of the Invention

This invention relates generally to audio amplifiers and speaker systems and, more specifically, to a circuit and method to prevent the "pop" sound in an audio system when the system is turned on, turned off, or muted.

2. Discussion of the Related Art

A disturbing sound occurs on most existing desktop or portable computers when there is a change of state of the system including when the power is initially applied, turned off, or muted. The sound is brief and sounds like a "pop," thus its name. The problem comes from the fact that the speaker, which can be modeled as a resistor, is driven by the output of an operational amplifier through an a.c. coupling capacitor. During a change of state, the output is commanded to a voltage far different than the current state, such as from an off state to an on state or the converse. The output of the operational amplifier, which is coupled to the speaker, responds at the slew rate of the operational amplifier, which can be in the range of volts per microsecond. This impulse response is in the audio range and because it is directly coupled through the bypass capacitor to the speaker it causes the speaker to respond.

At the present time there is a costly method of solving the problem in home audio and television systems. The solution prevalent in that marketplace is to place a low R-on MOSFET in series with the speaker. During power-up, powerdown, or mute the MOSFET switch is opened prior to enabling or disabling the operational amplifier. Thus, the high slew rate of the amplifier is not seen by the speaker. Once the amplifier has settled to its steady-state value, the MOSFET is switched on. This typically involves a time delay between the amplifier enabling the MOSFET switch. As can be appreciated, logic is required in the system to achieve the required delay.

What is needed is an inexpensive circuit and method to provide a popless audio amplifier for use in computer audio systems as well in stereo, radio and television audio systems.

SUMMARY OF THE INVENTION

A popless amplifier for use in an audio system that undergoes a change of state such as from off to on. The audio system includes an operational amplifier to drive a speaker through a coupling amplifier. The operational amplifier is disabled and is therefore prevented from providing an output to the speaker during a first selectable period of time after the change of state of the system. During the time the operational amplifier is disabled a voltage is applied to the output of the operational amplifier.

The present invention is better understood upon consideration of the detailed description below, in conjunction with the accompanying drawings. As will become readily apparent to those skilled in this art from the following description there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings.

DETAILED DESCRIPTION

Figure 1:
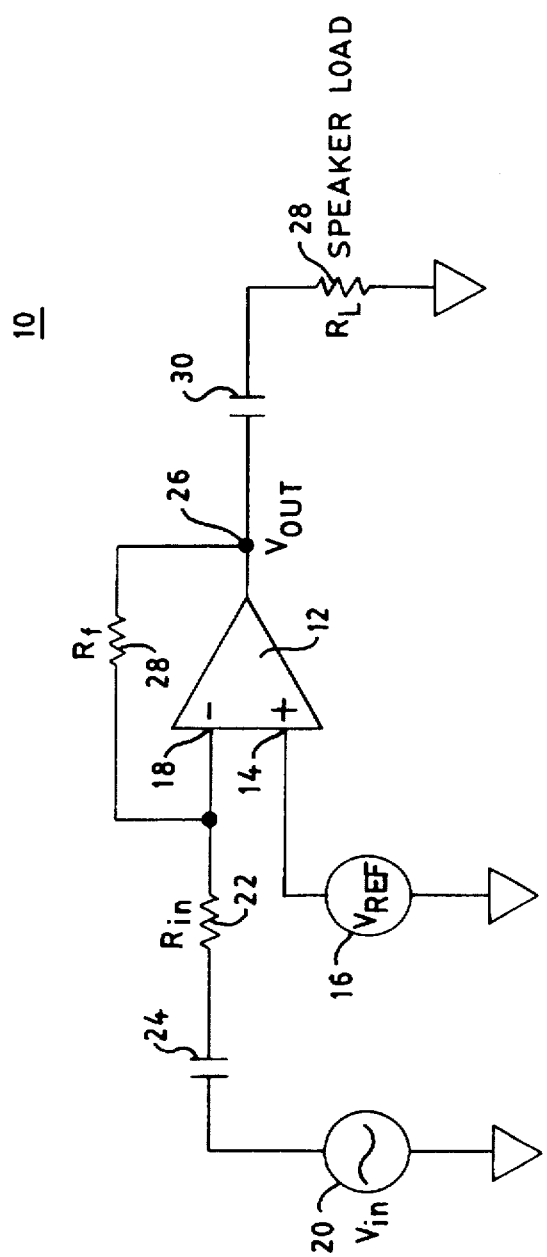
FIG. 1 is a block diagram of a prior art audio amplifier.

In the following description, for purposes of clarity and conciseness of the description, not all of the numerous components shown in the schematics are described. The numerous components are shown in the drawings to provide a person of ordinary skill in the art a thorough enabling disclosure of the present invention. It will be apparent to one skilled in the art that a detailed description of all of the specific components is not required in order for one of ordinary skill in the art to practice the present invention. Therefore, only those components that are affected by the present invention or that are necessary for an understanding of the present invention will be discussed. In addition, well known electrical structures and circuits are also shown in block diagram form in order to not obscure the present invention unnecessarily.

Referring now to FIG. 1 there is shown a prior art audio amplifier system 10 that may be used in various applications including a stereo audio system or a personal computer audio system such as a desktop computer audio system, a laptop computer audio system, or a notebook computer audio system. It will become clear to one of ordinary skill in the art that the present invention can be used in any audio system. The various specific values discussed in the following detailed description are those that would be appropriate for the present invention as it would be utilized in a personal computer system. One of ordinary skill in the art will be able to adjust the various values for other applications of the present invention.

The audio amplifier system 10 comprises an operational amplifier 12, also known as a power amplifier, having a first input 14 from a reference voltage source of 5.0–5.2 volts, shown at 16, typically a reference voltage of $V_{cc}/2$. The operational amplifier 12 has a second input 18 coupled to an input signal $V_{in}$ 20 through input resistor $R_{in}$ 22 and capacitor 24. Also connected to second input 18 is feedback from the output $V_{out}$ 26 of the operational amplifier 12 through feedback resistor $R_f$ 28. Coupled to the output of operational amplifier 12 is a speaker represented by a resistive load 28 through a coupling capacitor 30. The resistive load of a typical speaker is either 4 ohms or 8 ohms. In addition, other speaker loads are contemplated. The typical coupling capacitor has a capacitance of 470 microfarads.

Figure 2:
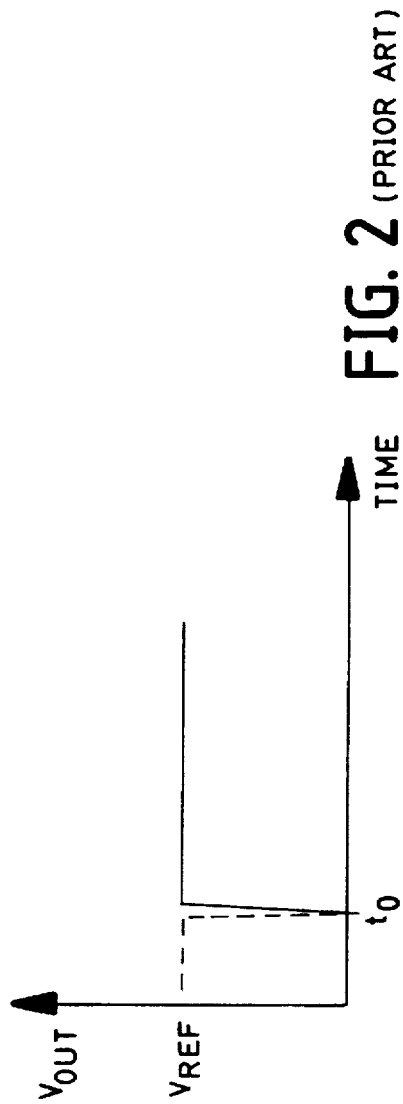
FIG. 2 is a graph of the voltage $V_{out}$ at the output of the operational amplifier of the prior art audio amplifier shown in FIG. 1 when the amplifier is enabled at time $t_0$.

FIG. 2 is a graphical representation of the output voltage $V_{out}$ from operational amplifier 12. FIG. 2 illustrates the source of the "pop" in an audio amplifier system. The pop is caused by the speaker being driven through the coupling capacitor 30 (FIG. 1) by the output of the operational amplifier 12 (FIG. 1). During a change-of-state, such as from off-to-on, the output of the operational amplifier is commanded to a voltage far different than the initial state (zero volts). The output $V_{out}$ responds at a slew rate of the operational amplifier 12 (FIG. 1), which can be on the order of volts per microsecond. This impulse response is in the audio range and directly couples through capacitor 30 (FIG. 1) to the speaker 28 (FIG. 1). FIG. 2 illustrates the jump of $V_{out}$ from zero volts to a value $V_{ref}$ in a time on the order of microseconds. As discussed above, there exists a costly means of preventing the pop in home audio and television systems. The solution is to place a MOSFET in series with the speaker and provide logic to turn the MOSFET off during a change-of-state of the system. This solution prevents the resulting virtually instantaneous voltage jump from zero volts to $V_{ref}$ caused by the high slew rate of the operational amplifier from being seen by the speaker. As can be appreciated there is logic necessary to switch the MOSFET on and off.

Figure 3:
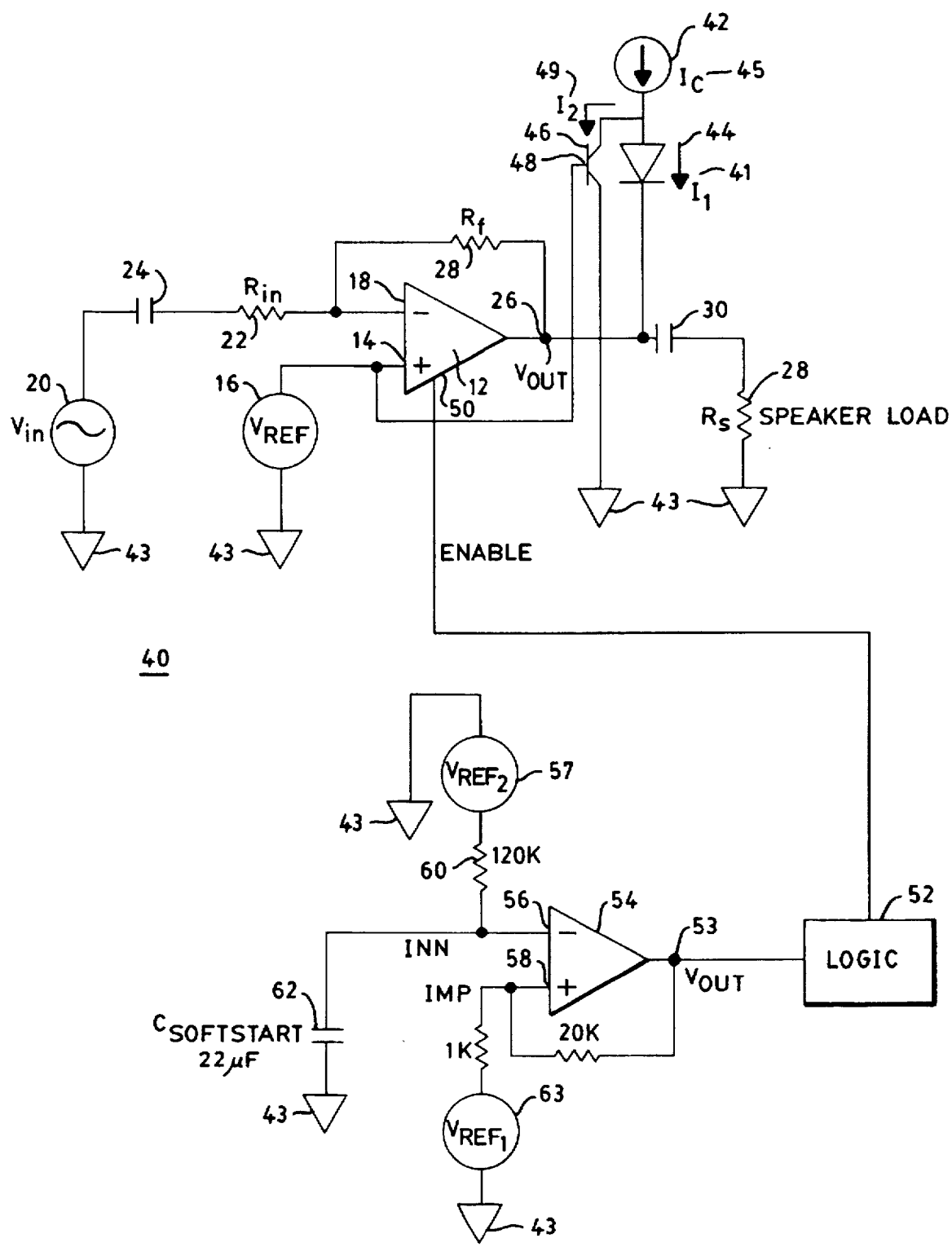
FIG. 3 is a block diagram of the popless amplifier of the present invention.

Referring now to FIG. 3 there is shown the popless amplifier 40 of the present invention. Like numerals are used for like components from FIG. 1. Popless amplifier 40 has, in addition to the components shown in FIG. 1, a current source 42, a diode 44 connected between current source 42 and the output 26 of operational amplifier 12, and a transistor 46 connected between current source 42 and ground 43. The base 48 of transistor 46 is connected to the input 14 of operational amplifier 12 which is also connected to $V_{ref}$ 16. Current source 42 outputs a current $I_c$ indicated at 45. In this application $I_c$ is on the order of 1.5 milliamps.

Operational amplifier 12 has an enable input 50 which is connected to logic 52. Logic 52 has an input from the output 53 of comparator 54 which has a first voltage input 56 and a second voltage input 58. First voltage input 56 is connected to an RC circuit made up of resistor 60 connected between first voltage input 56 and $V_{ref2}$ 57 and capacitor 62, also referred to as $C_{softstart}$ connected between first voltage input 56 and ground 43. The value of $V_{ref2}$ 57 is 7.5 volts in this embodiment. Typical values for resistor 60 is 120 Kohms and for capacitor 62 is 22 microfarads. Second voltage input 58 to comparator 54 is connected to $V_{ref1}$ 63 through resistor 64. $V_{ref1}$ 63 is typically 5 volts.

Figure 6:
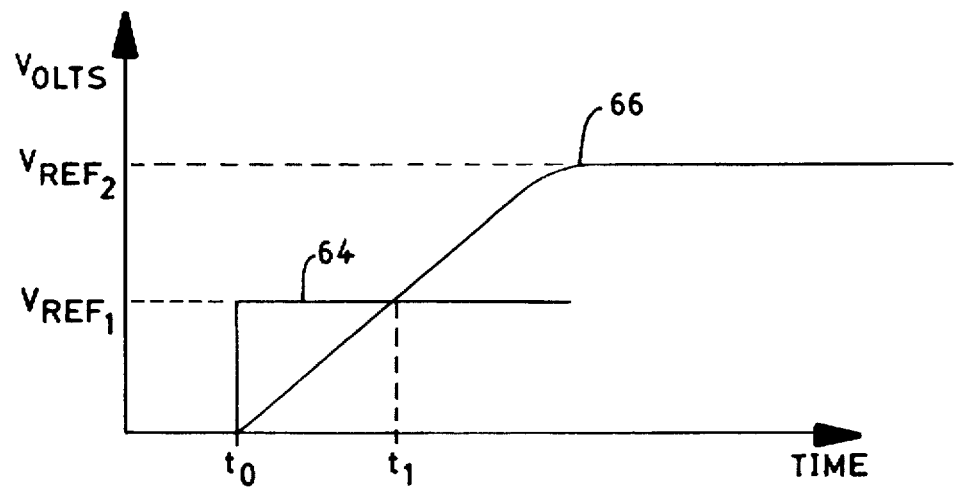
FIG. 6 is a graph of the first and second input voltages to the comparator shown in FIG. 3.
Figure 7:
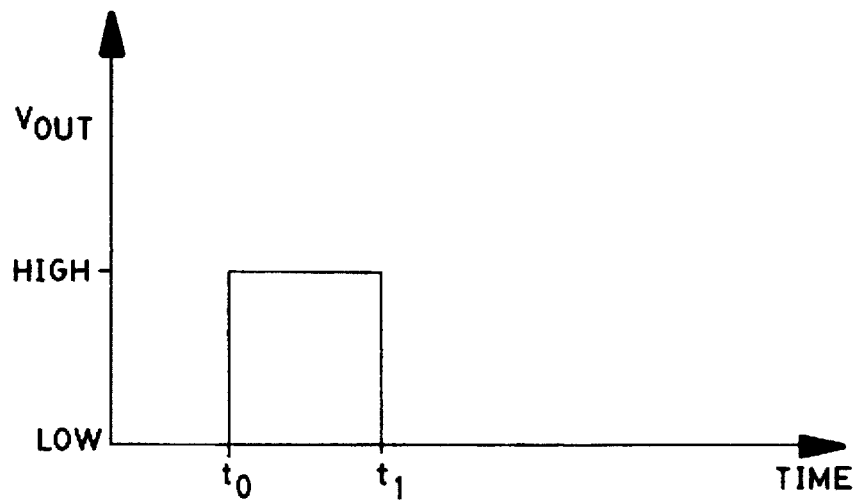
FIG. 7 is a graph of the output of the comparator shown in FIG. 3.

The operation of the present invention is now explained with reference to FIGS. 3–7. The present invention functions basically by disabling operational amplifier 12 (FIG. 3) and allowing output 26 to reach a predetermined steady state value. During start-up, the operational amplifier 12 is disabled by comparator 54 which delays the enabling of operational amplifier 12 for a selected period of time. Nominally, this selected period of time is approximately 2 seconds which is determined by capacitor 62 and resistor 60. As discussed above, to achieve the approximate 2 second delay, capacitor 62 has a value of 22 microfarads and resistor 60 has a value of 120 Kohms. When the voltage at input 56 ramps to a threshold voltage level, comparator 54 goes from a low to a high. The threshold voltage level is determined by the value of $V_{ref1}$, which in this example is approximately 5 volts. Referring to FIG. 6 there is shown the voltages at input 58 and input 56 of comparator 54. Curve 64 represents the voltage at input 58 of comparator 54 and curve 66 represents the voltage at input 56. FIG. 7 shows the output 53 of comparator 54 and indicates that as long as the voltage at input 56 (curve 66) is less than the voltage at input 58 (curve 64) the output of comparator 54 will be high and as long as the voltage at input 56 is greater than the voltage at input 58 the output of comparator 54 will be low.

The output 53 of comparator 54 is input to logic 52 and when output 53 is high logic 52 disables operational amplifier 12. When the voltage at input 56 of comparator 54 becomes greater than the voltage at input 58 of comparator 54 the output 53 of comparator 54 changes to low causing logic 52 to enable operational amplifier 12.

Figure 4:
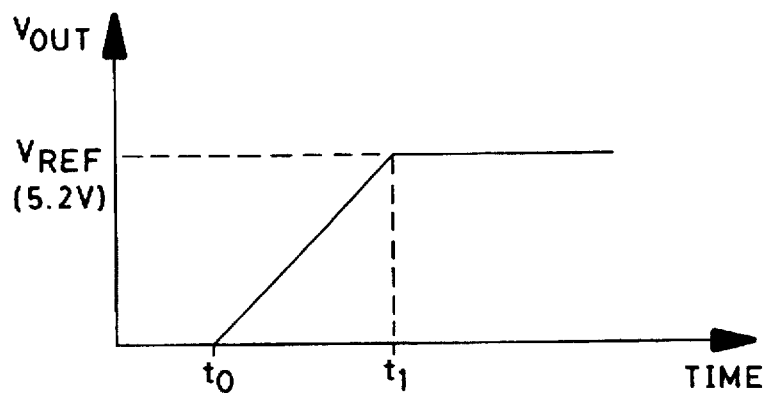
FIG. 4 is a graph of the voltage $V_{out}$ at the output of the operational amplifier of the present invention.
Figure 5:
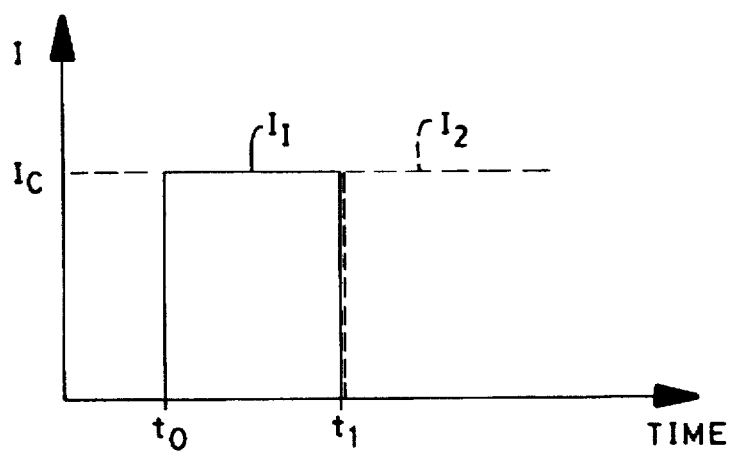
FIG. 5 is a graph of the current from the current source shown in FIG. 3.

During the period that operational amplifier 12 is disabled, the output of operational amplifier 12 is being charged by current source 42 through diode 44. The current source 42 and capacitor 30 create a 1 Hz to 5 Hz time constant which appears on the speaker 28. However, this low frequency signal is out of the audio range and thus can not be heard. The output of operational amplifier 12 slowly slews up to a reference voltage, which is applied to the base 48 of transistor 46, which is set to be equal to the dc mid-rail bias voltage during normal operation of the system. In this example, the reference voltage applied to base 48 is $V_{ref}$ which is set at approximately 5 volts. When the voltage at the output 26 reaches a value equal to the voltage at the base 48 of transistor 46, transistor 46 switches on and all of the current from current source 42 is applied to ground. This switching of the current from diode 44, represented by $I_1$ at 41, to transistor 46, represented by $I_2$ at 49, is shown graphically in FIG. 5. FIG. 4 is a graphical representation of the output voltage $V_{out}$ 26 of operational amplifier 12. As can be appreciated, when operational amplifier 12 is enabled by logic 52 there is no high slew rate of the voltage at the output of operational amplifier because the output has already achieved its nominal level. Therefore, there is no pop.

Figure 8:
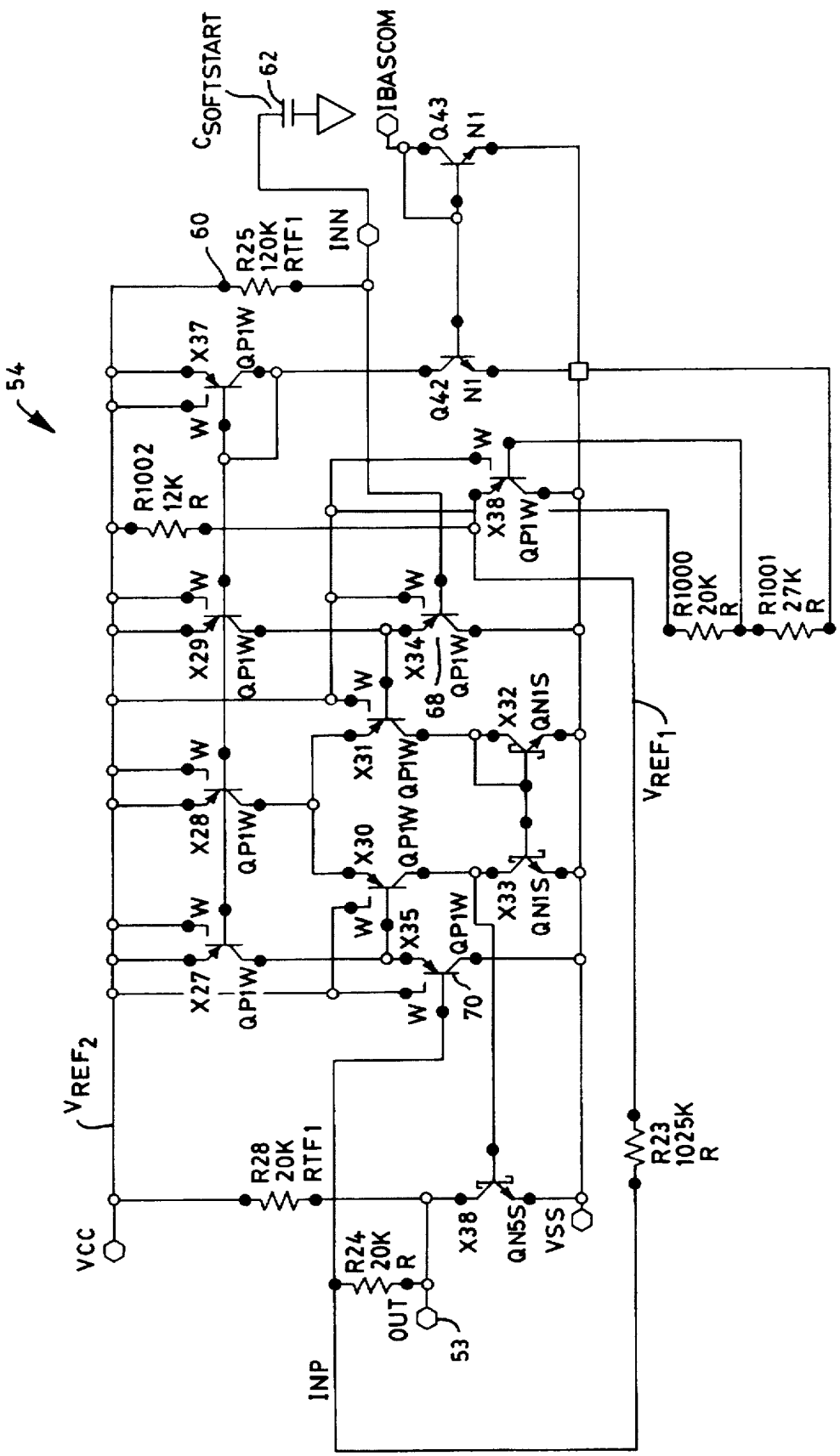
FIG. 8 is a schematic of the comparator circuit shown in FIG. 3.

Referring now to FIG. 8 there is shown a detailed schematic of the comparator 54 showing the external connection of capacitor 62 ($C_{softstart}$). It is noted that capacitor 62 is connected externally so that the time the operational amplifier is disabled can be selectable by changing the value of capacitor 62. Resistor 60 (R25) coupled with the capacitor 62 ($C_{softstart}$) determines the approximately 2 second delay discussed above. Transistors 68 (X34) and 70 (X35) are the inputs 56 and 58, respectively, to comparator 54 (FIG. 3). The voltage at the base of transistor 70 (X35) is set from a voltage divider from the supply voltage $V_{cc}$. The output 53 of comparator is input to logic 52 (FIG. 3 and FIG. 9).

Figure 9:
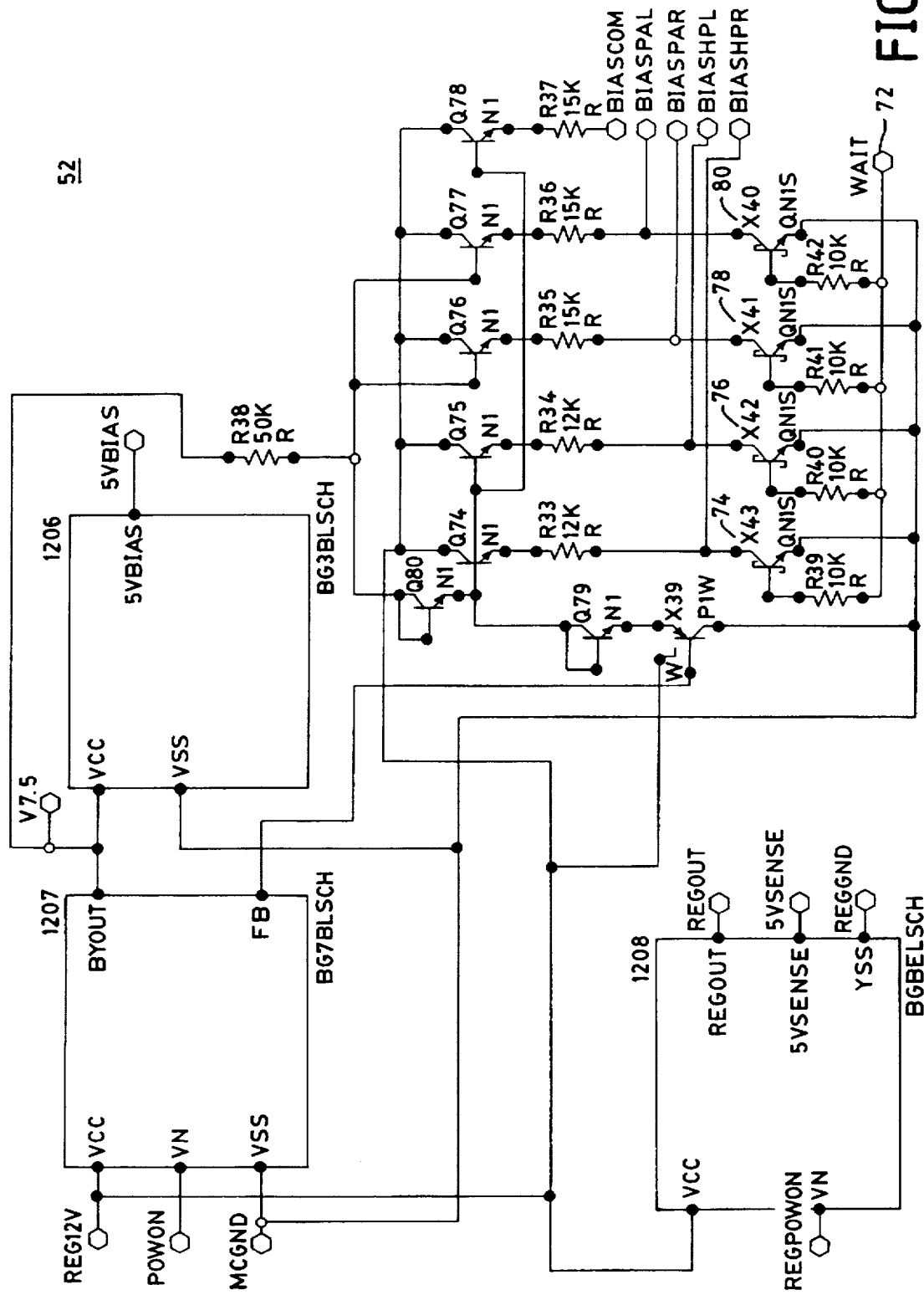
FIG. 9 is a schematic of the logic circuit shown in FIG. 3.
Figure 10:
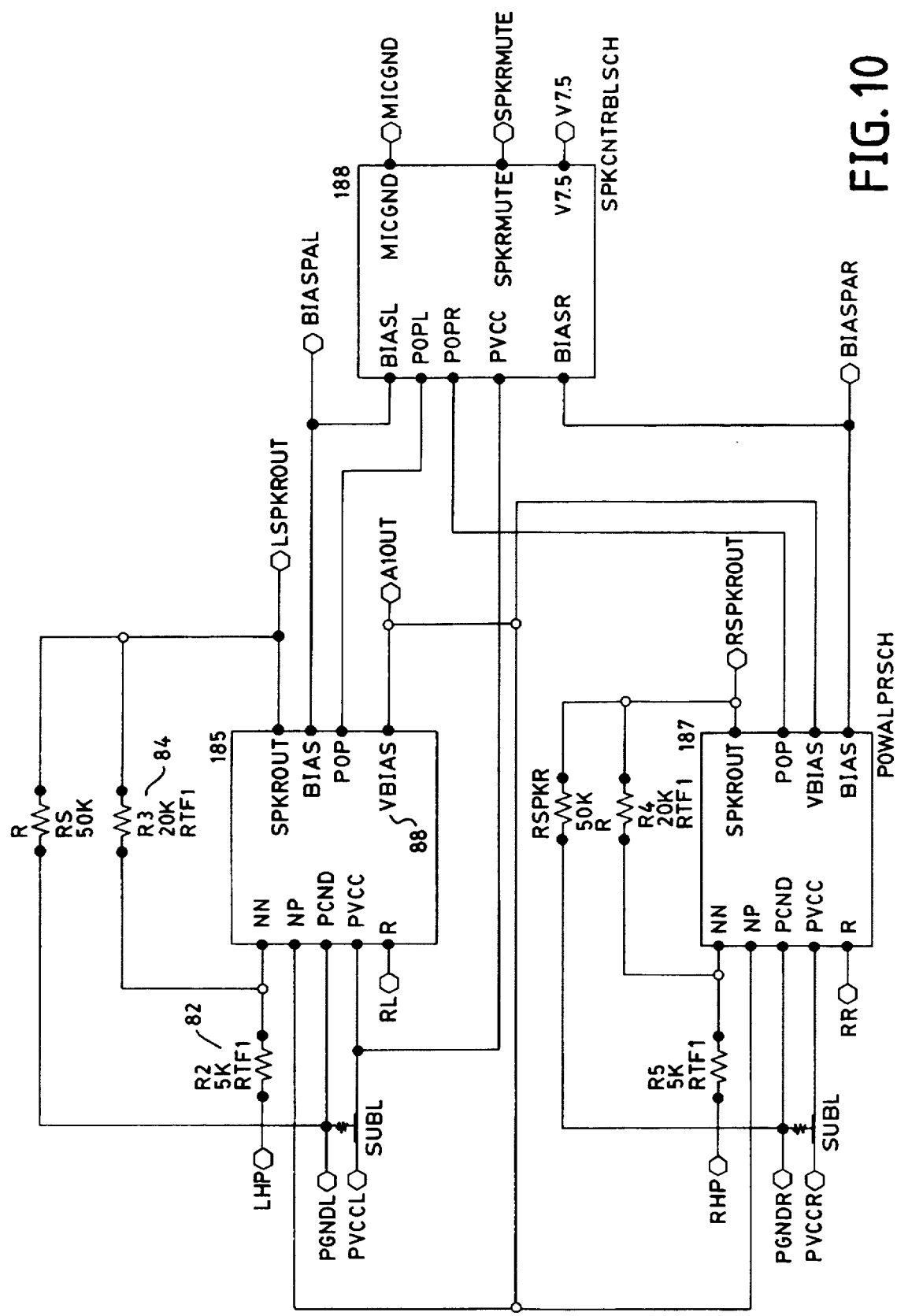
FIG. 10 is a schematic of a speaker connection utilizing the present invention.

Referring now to FIG. 9 there is shown a schematic of logic 52. The output 53 (FIGS. 3 and 8) from comparator 54 is input to logic 52 at wait pin 72. Logic 52 generates all of the bias currents for the amplifier. When the input at wait pin 72 is high, transistors 74 (X43), 76 (X42), 78 (X41), and 80 (X40) are on, disabling all bias currents for the speaker amplifiers. Thus, the amplifiers, such as operational amplifier 12 (FIG. 3) are off until the input at wait pin 72 changes to low. This occurs, as discussed above, after the time period determined by the relative values of capacitor 62 and resistor 60 (FIGS. 3 and 8) elapses. After the time period elapses, the base voltage of transistor 68 (X34) is charged to a higher voltage than the base of transistor 70 (X35) which causes the output 53 of comparator 54 (FIG. 3) to go low which, in turn, pulls the wait pin 72 to low. When wait pin 72 is low, transistors 74 (X43), 76 (X42), 78 (X41), and 80 (X40) are turned off, enabling all bias currents for the speaker amplifiers. When the amplifiers are enabled, the amplifier output will be forced to the mid-rail bias voltage due to the feedback resistors 82 (R2) and 84 (R3) (FIG. 10). As discussed above, before the amplifiers are enabled, the output 26 of operational amplifier 12 (FIG. 3) which is coupled to speaker 28 via capacitor 30 is slowly charged to a voltage near the mid-rail voltage and is determined by the value of $V_{ref}$ which is input to the base 48 of transistor 46.

Figure 11:
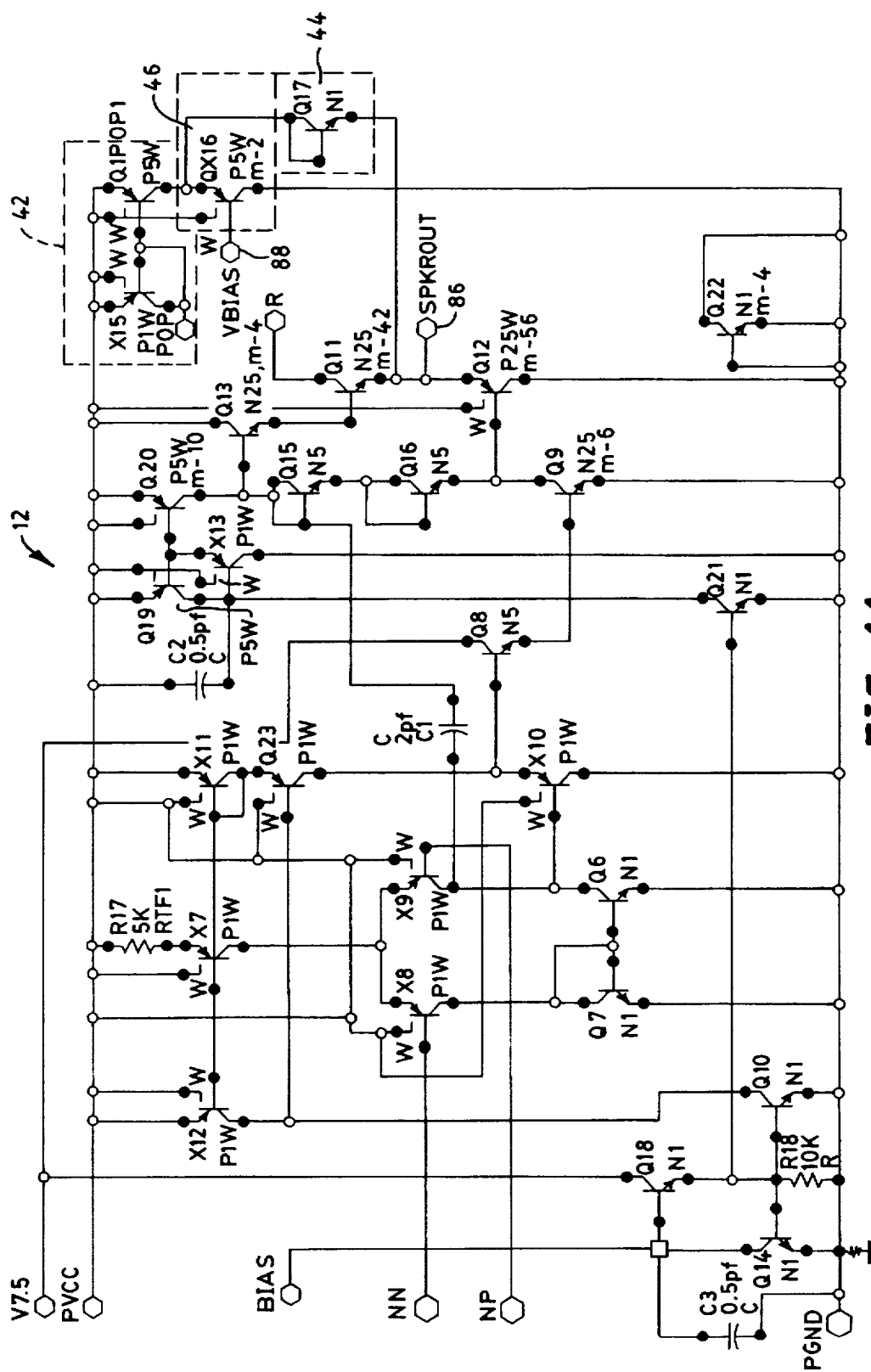
FIG. 11 is a schematic of the operational amplifier and current source circuit shown in FIG. 3.

Referring now to FIG. 11 there is shown a schematic of operational amplifier 12 and the current source 42, transistor 46, and diode 44 (a transistor connected as a diode). While the wait input 72 (FIG. 9) is high the operational amplifier 12 is disabled, the current source 42 provides a charging current to coupling capacitor 30 connected to the SPKROUT terminal 86. When the voltage at SPKROUT terminal 86 is equal to the voltage at VBIAS pin 88 (which is connected to $V_{ref}$(FIG. 3)) as discussed above, the charging current from current source 42 is disconnected from the output 26 of operational amplifier 12 (FIG. 3) by transistor 46. As discussed above, the voltage at SPKROUT terminal 86 is slowly ramped to a voltage equal to the voltage at VBIAS pin 88. Referring to FIG. 3 it can be observed that the VBIAS voltage is equal to the amplifier's mid-rail voltage because it is connected to the positive input signal of operational amplifier 12. Referring to FIG. 10, the VBIAS pin 88 is connected to the positive input signal (INP) of the operational amplifier 12.

The foregoing description of the preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. A popless amplifier for use in a system that undergoes a change of state, comprising:

an operational amplifier having an enable input and an output;

a speaker connected to the output of the operational amplifier;

a circuit to prevent the application of an output voltage from the operational amplifier to the speaker for a first selectable period of time during a change of state of the system; and a circuit to apply a voltage to the output of the operational amplifier during the first selectable period of time.

2. A popless amplifier as in claim 1, wherein an output of said circuit to prevent the application of a voltage from the operational amplifier to the speaker is connected to the enable input of the operational amplifier.

3. A popless amplifier as in claim 2, wherein said circuit to prevent the application of a voltage from the operational amplifier to the speaker comprises a comparator having a logic high output voltage when a first input voltage to the comparator is greater than a second input voltage to the comparator.

4. A popless amplifier as in claim 3, wherein said circuit to prevent the application of a voltage from the operational amplifier to the speaker further comprises a circuit to ramp said second input voltage from zero volts during the change of state of the system.

5. A popless amplifier as in claim 4, wherein said circuit to ramp comprises an RC circuit connected to a first reference voltage and ground.

6. A popless amplifier as in claim 5, wherein said first selectable period of time is determined by the relative values of the resistance and the capacitance in the RC circuit.

7. A popless amplifier as in claim 6, wherein said circuit to prevent the application of a voltage from the operational amplifier to the speaker further comprises a logic circuit with an input from said comparator and an output to said enable input of said operational amplifier.

8. A popless amplifier as in claim 7, wherein said circuit to apply a voltage to the output of the operational amplifier during the first selectable period of time comprises a current source connected to the output of the operational amplifier.

9. A popless amplifier as in claim 8, wherein said circuit to apply a voltage to the output of the operational amplifier further comprises a circuit to switch a current from the current source from the output of the operational amplifier to ground after a second selectable period of time.

10. A popless amplifier as in claim 9, wherein said circuit to apply a voltage to the output of the operational amplifier further comprises a diode connected between said current source and the output of the operational amplifier.

11. A popless amplifier as in claim 10, wherein said circuit to switch comprises a transistor connected between said current source and ground.

12. A popless amplifier as in claim 11, wherein said second selectable period of time is determined when the voltage at the output of the operational amplifier is equal to a second reference voltage applied to a base of said transistor.

13. A popless amplifier as in claim 12, further comprising a coupling capacitor connected between the output of the operational amplifier and the speaker.

14. A popless amplifier as in claim 13, wherein said coupling capacitor causes the voltage applied to the output of the operational amplifier to ramp from zero volts until the voltage at the output of the operational amplifier is equal to the second reference voltage applied to the base of said transistor.

15. A popless amplifier as in claim 14, wherein said second selectable period of time is determined by the value of said capacitor and the value of the current from the current source.

16. A popless amplifier as in claim 15, wherein said first selectable period of time is greater than said second selectable period of time.

17. A method to prevent a pop in the output of an audio system during a change of state of the system, wherein said system comprises an operational amplifier and a speaker, said method comprising the steps of:

preventing the application of an output voltage from the operational amplifier to the speaker for a first selectable period of time during a change of state of the system; and applying a voltage to the output of the operational amplifier during the first selectable period of time.

18. A method as in claim 17, wherein the step of preventing the application of an output voltage from the operational amplifier to the speaker is accomplished by a step of providing a disable signal to the operational amplifier.

19. A method as in claim 18, wherein the step of providing a disable signal to the operational amplifier is accomplished by:

comparing a first voltage to a second voltage; and providing said disable signal when said first voltage is greater than said second voltage.

20. A method as in claim 19, further comprising the step of ramping said second voltage from zero volts during the change of state of the system.

21. A method as in claim 20, further comprising a step of determining the first selectable period of time.

22. A method as in claim 21, wherein said step of applying a voltage to the output of the operational amplifier during the first selectable period of time is accomplished by the step of applying a current to the output of the operational amplifier for a second selectable period of time.

23. A method as in claim 22, further comprising the step of determining the second selectable period of time.

24. A method as in claim 23, further comprising the step of switching said current from the output of the operational amplifier to ground at the end of said second selectable period of time.

25. A method as in claim 24, wherein said step of determining the second selectable period of time is accomplished by comparing the voltage at the output of the operational amplifier to a reference voltage.

* * * * *